THERMOELECTRIC MODULE ASSEMBLY TECHNIQUE

Filed Dec. 28, 1962 2 Sheets-Sheet 1

Inventors:
Boubene M. Jaremus
Temple Nieter and
Charles E. Rufer
By: F. A. Krusemark Atty.

THERMOELECTRIC MODULE ASSEMBLY TECHNIQUE

Inventors:
Boubene M. Jaremus
Temple Nieter and
Charles E. Rufer
By: F. A. Kruemmel Atty.

United States Patent Office 3,247,577
Patented Apr. 26, 1966

3,247,577
THERMOELECTRIC MODULE ASSEMBLY TECHNIQUE

Boubene M. Jaremus, Barrington, Temple Nieter, Evanston, and Charles E. Rufer, Park Ridge, Ill., assignors to Borg-Warner Corporation, Chicago, Ill., a corporation of Illinois Filed Dec. 28, 1962, Ser. No. 248,032
2 Claims. (Cl. 29—155.5)

The present invention relates to thermoelectric module assemblies and, more particularly, to the materials used and the method of connecting the modules to the base plates or substrata.

In the manufacture of thermoelectric modules for use in heat pumps the importance of maximum performance is stressed. The technique employed in the present invention involves the use of materials and certain steps not normally used in making thermoelectric devices.

It is, therefore, an important object of the present invention to provide an interface comprising an alumina wafer fired with a silver circuit pattern.

It is another important object of the present invention to provide an improved thermoelectric module assembly which provides high performance.

It is another important object of the present invention to provide an improved method of making a high performing thermoelectric module that is economical to manufacture and durable.

The present invention consists of the novel methods, constructions, arrangements and devices to be hereinafter described and claimed for carrying out the above stated objects and such other objects as will be apparent from the following description of a preferred form of the invention, illustrated with reference to the accompanying drawings, wherein:

Figure 5:
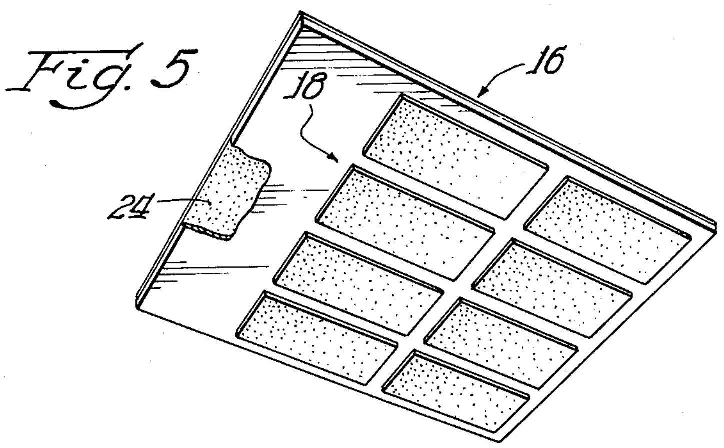
Figures 4, 6:
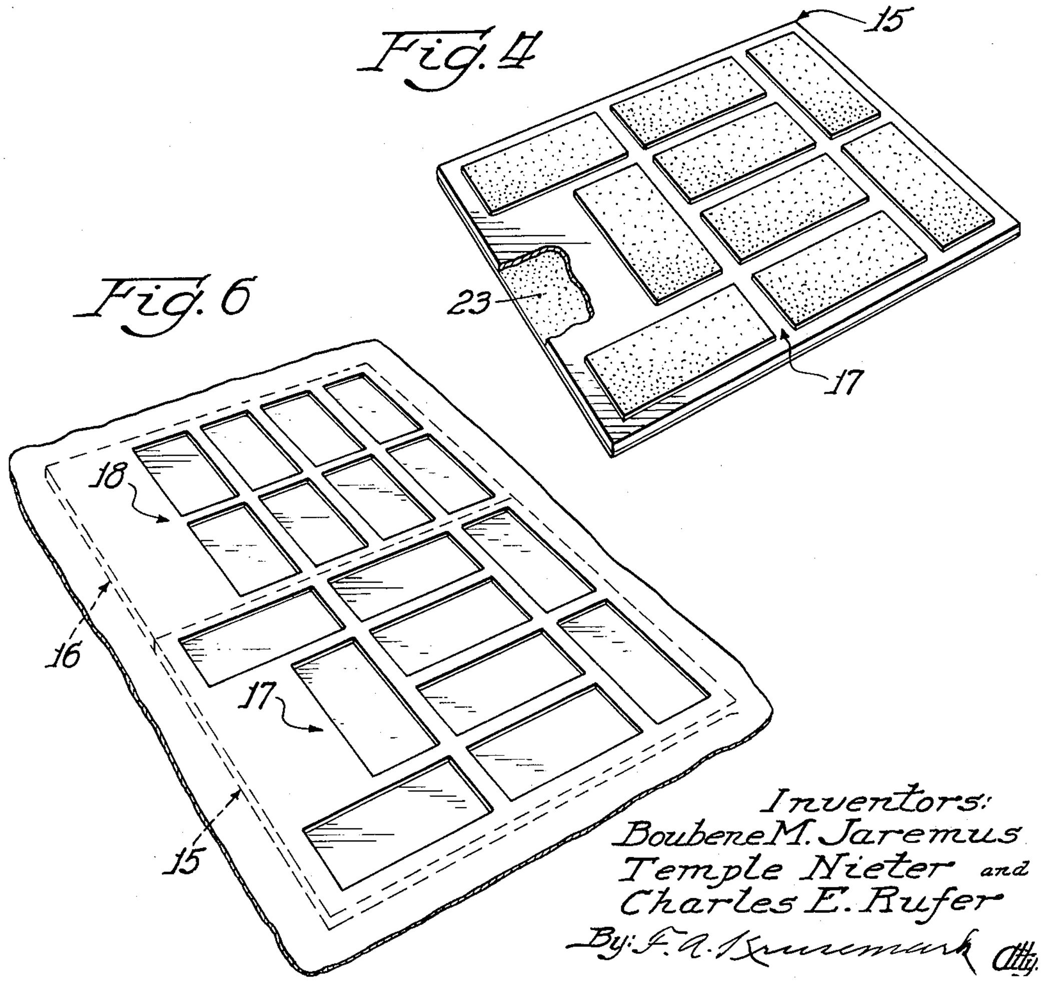
FIGURE 4 is a perspective view of an aluminum oxide interface wafer, partially broken away, according to the present invention having a film of silver on one face and a silver film on its other face in the form of a circuit pattern matching the pattern of the hot junctions of a thermoelectric module.

FIGURE 5 is a perspective view of an aluminum oxide interface wafer, partially broken away, according to the present invention having a film of silver on one face and a silver film on its other face in the form of a circuit pattern matching the pattern of the cold junctions of a thermoelectric module; and, FIGURE 6 is a perspective view of a silk screen for use in providing the silver circuit patterns shown in FIGURES 4 and 5.

Like characters of reference designate like parts in the several views.

Figure 1:
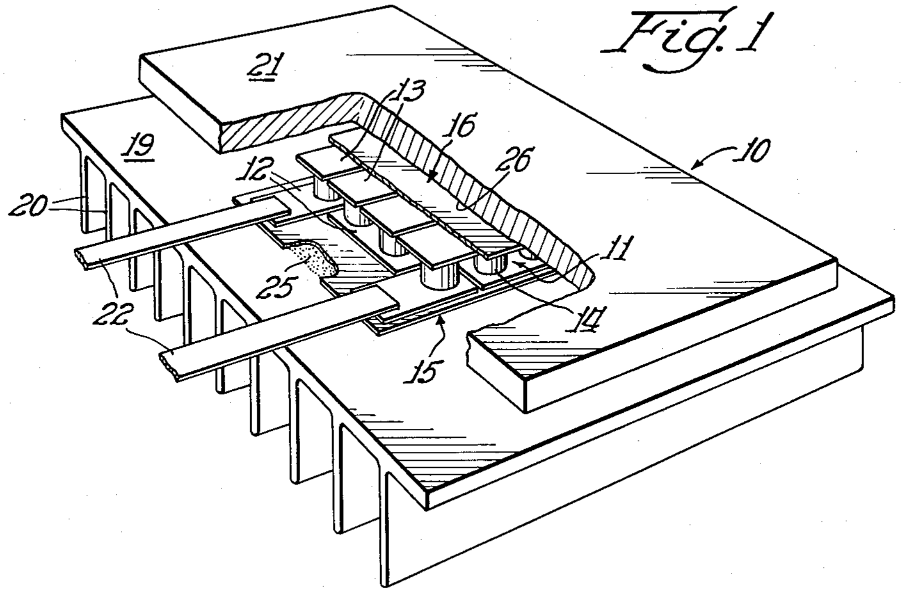
FIGURE 1 is a perspective view, partially broken away, of a heat pump assembly showing the modules assembled according to the present invention.
Figure 2:
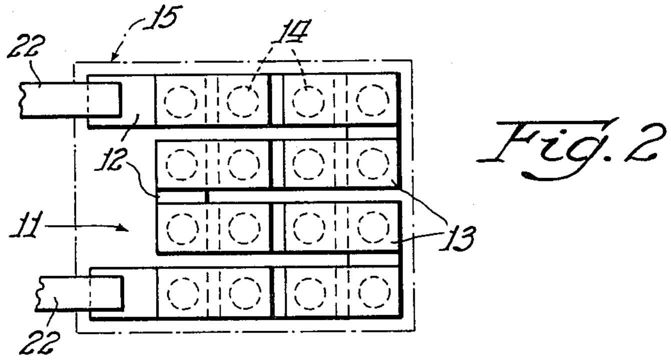
FIGURE 2 is a plan view showing the cold side or cold junction of a thermoelectric module.
Figure 3:
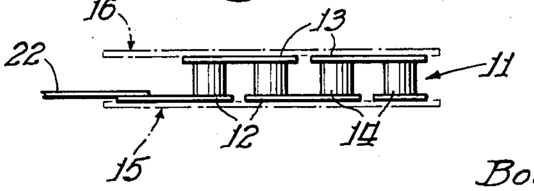
FIGURE 3 is an end elevational view of the module shown in FIGURE 2 provided with interfaces.

Referring now to FIGURE 1, a heat pump 10 is shown having a module assembly 11 comprising bus bars 12 and 13 constituting the cold and hot junctions, respectively, interconnected by thermal elements 14. Aluminum oxide interface wafers 15 and 16 having silver circuit patterns 17 and 18, respectively, shown in FIGURES 4 and 5 which match the patterns of the bus bars 12 and 13, respectively, are connected between the bus bars 12 and an aluminum substrata or base plate 19 having fins 20; and between the bus bars 13 and an aluminum substrata or base plate 21, respectively. Electrical leads 22 are shown attached to the hot side of the thermoelectric module 11. The outer faces of the aluminum oxide interface wafers 15 and 16 are coated with silver films 23 and 24, respectively, shown in FIGURES 4 and 5, and the inner surfaces of the base plates 19 and 21 are coated with copper films 25 and 26 in the areas facing the aluminum oxide interface wafers 15 and 16, respectively. This is accomplished by means or methods already known in the art. All the silver films referred to above are commercially available in the form of a paste, which after being applied are flame cured.

The heat pump according to the present invention comprises the module assembly 11 provided with the thermal conductive dielectric aluminum oxide interface wafers 15 and 16 attached to the bus bars 12 and 13, and interconnected between the back plates 19 and 21.

In order that the various components of the heat pump may be interconnected, the silver films of the wafers 15 and 16, the bus bars 12 and 13, and base plates 19 and 21 at their copper film areas are tinned with a low temperature solder.

With the various components thus prepared, the heat pump according to the present invention, may be completed as a unit by assembling the respective aluminum oxide interfaces between their respective bus bars of the module assembly 11 and base plates in matching engagement, after which pressure and temperature to a degree to effect a union are applied.

It may be desirable to first prepare the module assembly 11 as a unit including the aluminum oxide wafers 15 and 16, in which case the aluminum oxide wafers are prepared as shown and assembled over the module assembly 11 with their respective silver circuit patterns in matching engagement with the respective bus bars. The assembly is then subjected to pressure and temperature to a degree to effect a union.

The preparation of modules in this manner with attached aluminum oxide wafers is desirable when a multiplicity of modules are used in a heat pump unit. In such event, the modules with interfaces attached are assembled between the base plates which have been prepared with tinned copper films as shown, followed by the application of pressure and temperature adequate to effect a union.

It is to be understood that the base plates 19 and 21 may be made of material other than aluminum and in the event copper is used, the provision of a film of copper on the base plates is omitted.

While this invention has been described in connection with certain specific embodiments thereof, it is to be understood that it is by way of illustration and not by way of limitation and the scope of this invention is defined solely by the appended claims which should be construed as broadly as the prior art will permit.

We claim:

1. The method of making a heat pump assembly of components comprising a thermoelectric module having hot and cold junctions defined by bus bars, first and second aluminum oxide wafers, and first and second base plates, comprising the steps of: applying conductive silver paste, to one side of each wafer in patterns which match the bus bar patterns, and substantially entirely across the other side of each wafer; applying heat to cure the silver paste; copper plating substantially an entire face of each base plate; tinning with solder the faces of the bus bars, the cured silver paste, and the copper plated base plates; assembling the aluminum oxide wafers on opposite sides of the thermoelectric module with the tinned silver paste patterns engaging the tinned bus bars, and assembling the base plates with the tinned copper plated faces engaging the other faces of the aluminum oxide wafers; and applying pressure and heat sufficient to join the module, wafers, and base plates in a unitary assembly.

2. The method of making a heat pump assembly according to claim 1 and including using silk screen stencils in the application of the conductive silver paste in patterns to one side of each wafer.

References Cited by the Examiner

UNITED STATES PATENTS

| | | | |
|---|---|---|---|
| 2,672,492 | 3/1954 | Sukacev | 136—4 |
| 2,844,638 | 7/1958 | Lindenblad | 136—4 |

| | | | |
|---|---|---|---|
| 2,877,539 | 3/1959 | Kinnan | 29—155.5 |
| 2,983,031 | 5/1961 | Blanchard | 29—155.5 |
| 3,110,100 | 11/1963 | Hill | 29—155.5 |

OTHER REFERENCES

Introduction to Printed Circuits: R. L. Swiggett, published in 1956 by John F. Rider, New York.

JOHN F. CAMPBELL, *Primary Examiner.*

WHITMORE A. WILTZ, *Examiner.*